United States Patent [19]

Iida et al.

[11] 4,342,004
[45] Jul. 27, 1982

[54] VOLTAGE COMPARATOR CIRCUIT

[75] Inventors: Tetsuya Iida; Tatsuo Sakaue, both of Yokohama, Japan

[73] Assignee: Tokyo Shibaura Denki Kabushiki Kaisha, Japan

[21] Appl. No.: 148,724

[22] Filed: May 12, 1980

[30] Foreign Application Priority Data

May 15, 1979 [JP] Japan .................................. 54-59303
May 15, 1979 [JP] Japan .................................. 54-59304

[51] Int. Cl.³ ............................................ H03F 3/45
[52] U.S. Cl. ..................................... 330/253; 330/277
[58] Field of Search ........................ 330/253, 261, 277

[56] References Cited

U.S. PATENT DOCUMENTS 4,267,517  5/1981  Iida et al. ............................ 330/253

OTHER PUBLICATIONS

C. R. Hewes et al., *Design of Complex CCD/MOS Integratd Circuits,* paper reported at fifth CCD International Meeting, Sep. 1979.

*Primary Examiner*—James B. Mullins
*Assistant Examiner*—Gene Wan
*Attorney, Agent, or Firm*—Finnegan, Henderson, Farabow, Garrett & Dunner

[57] ABSTRACT

The comparator circuit of the invention is provided with a bias voltage generating section which produces a bias voltage corresponded to an output voltage of a differential amplifier section. The bias voltage of the bias voltage generating section is applied to the load elements of a linear amplifier section, which have the same characteristic respectively.

On the other hand the output voltage from the differential amplifier section is converted into DC operating point voltage of the linear amplifier section, which is applied to the drive elements of which characteristics are same each other.

22 Claims, 6 Drawing Figures

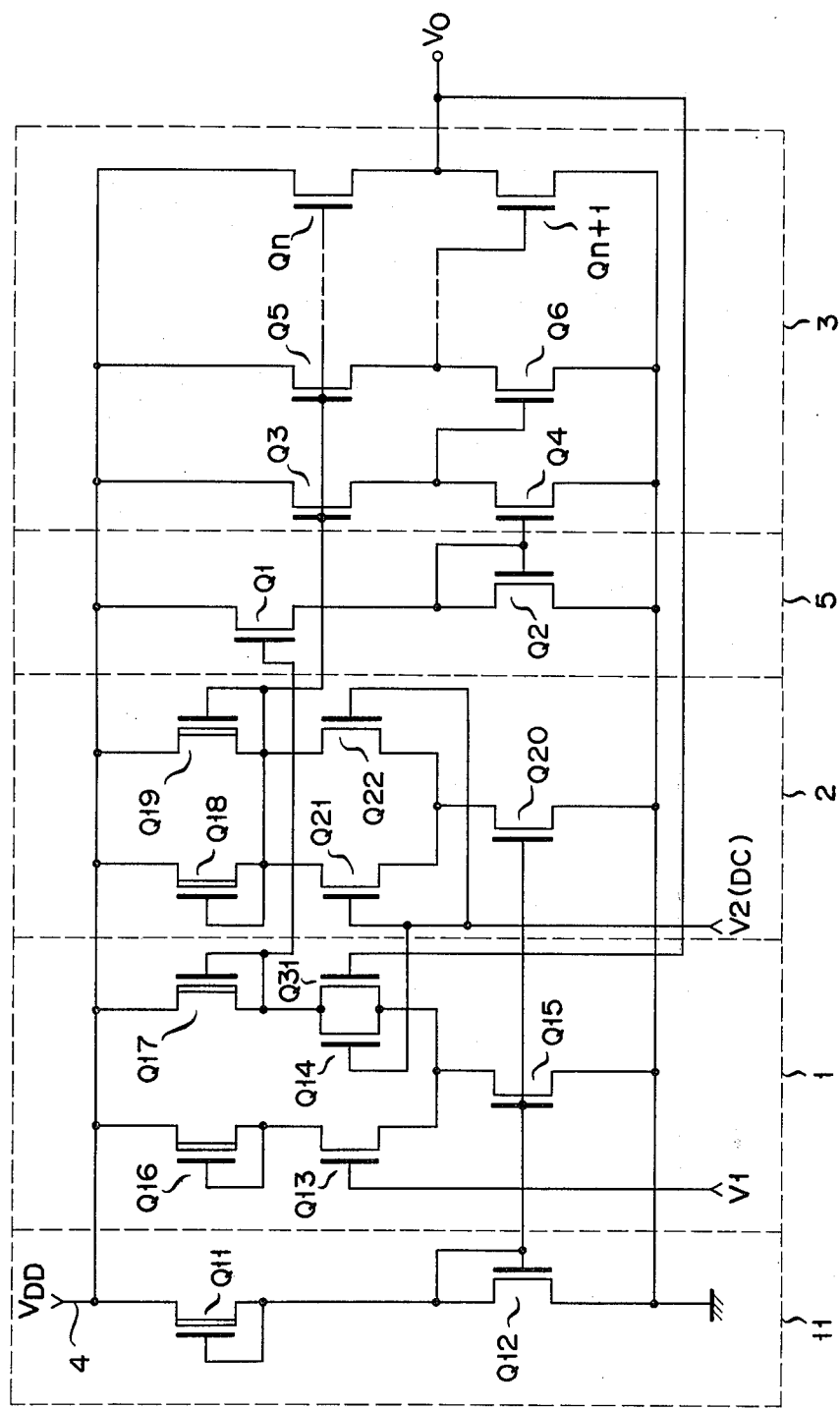

VOLTAGE COMPARATOR CIRCUIT

The present invention relates to a voltage comparator circuit comprised of a single channel type MOS transistor (or an insulated gate type field effect transistor).

Many types of voltage comparator circuits comprised of bipolar transistors or complementary MOS transistors are widely marketed, being frequently contained in A/D converters. As far as the present applicant searched, there is not found commercialized comparators comprised of single channel type MOS transistors, except some examples disclosed in some papers. One of some examples is found in a paper entitled "Operational Amplifier" by C. R. Hewes et al. in the 5th CCD conference on September, 1979. The amplifier, using a single channel MOS, is a differential amplifier section comprised of enhancement type transistors and depletion type transistors, and a linear amplifier (inverter). The circuit construction employs the enhancement type and the depletion type transistors, so that the circuit construction lacks symmetry, leading to a variation in the gain.

On the other hand, single channel type MOS transistors are widely used, and it is desired that a peripheral circuit be constructed by the single channel type MOS transistors and that a single channel type comparator be used.

Accordingly, an object of the present invention is to provide a voltage comparator circuit of which the offset voltage is minimized and the voltage gain is large, by using a differential amplifier, a differential amplifier section output bias voltage generating circuit and a linear amplifier section, which are all comprised of single channel type MOS transistors.

Another object of the present invention is to provide a voltage comparator circuit of which the offset voltage is minimized and the voltage gain is large, by using a differential amplifier, a differential amplifier output bias voltage generating circuit and a linear amplifier section, which are all comprised of single channel type MOS transistors, and which has a hysteresis for the input/output characteristic of the differential amplifier section.

To achieve the above objects, there is provided a voltage comparator comprising: a differential amplifier section for producing a signal corresponding to a difference between two input signals; a differential amplifier section output bias voltage generating section for producing a voltage corresponding to the output bias voltage of the differential amplifier section; a linear amplifier section in which a plurality of drive elements and a plurality of load elements are connected, and of which a DC operating point is determined by a voltage from the differential amplifier section output bias voltage generating section; and a converting section which is inserted between the differential amplifier section and the linear amplifier section, and converts the output signal from said differential amplifier section into the DC operating point of the linear amplifier section; wherein the differential amplifier section, the differential amplifier section output bias voltage generating section the linear amplifier section, and the converting section are comprised of MOS transistors of the same channel.

Other objects and features of the present invention will be apparent from the following description taken in connection with the accompanying drawings, in which:

FIG. 6 is a circuit diagram of another example of the circuit shown in FIG. 4.

Figure 1:
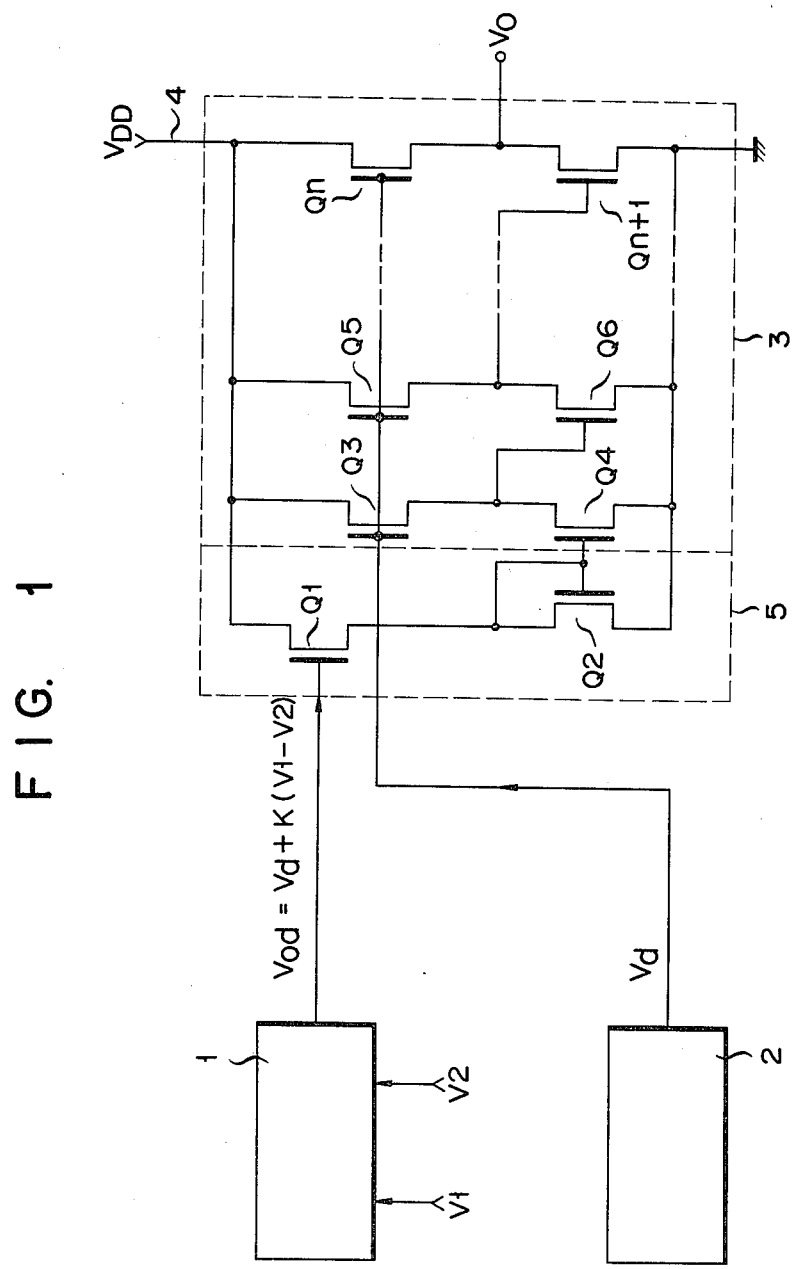
FIG. 1 is a block diagram of an embodiment of a voltage comparator circuit according to the present invention.

Reference is made to FIG. 1 illustrating an embodiment of a voltage comparator circuit according to the invention. MOS transistors used in the embodiment are all of the N-channel type.

When supplied with input voltages V1 and V2, a differential amplifier section 1 produces an output bias voltage Vod if the voltages V1 and V2 are equal to each other. The output bias voltage Vod is given $$Vod = Vd + K(V1 - V2) \tag{1}$$

where Vd is an output bias voltage and K is a voltage gain of the differential amplifier section. The output bias voltage Vod is supplied to a converting section 5. In the converting section 5, MOS transistors Q1 and Q2 are connected in series between a $V_{DD}$ potential supply terminal 4 and ground. The gate of the transistor Q1 is connected to the output terminal of the differential amplifier section 1 and the gate of the transistor Q2 is connected to the drain terminal of itself. The converting section 5 determines a DC operating point of a linear amplifier section 3.

The linear amplifier section 3 for controlling the voltage gain by the number of linear amplifiers is comprised of a plurality of linear amplifiers of enhancement type MOS transistors in cascade connection. MOS transistors Q3 and Q4 are connected in series between the $V_{DD}$ potential supply terminal 4 and ground. In the subsequent stages, the pairs of Q5 and Q6, ..., Qn and Qn+1 are connected in series therebetween similarly. The transistor Q4 is a drive transistor of an MOS type in the first linear amplifier stage. The gate of the transistor Q4 is connected to the source of a drive transistor Q1. To the gates of the drive MOS transistors Q6, ... Qn+1 in the subsequent amplifier stages are applied the output signals from the prestage amplifiers. To the gates of the load MOS transistors Q3, Q5, ..., Qn is applied the output signal produced from a differential amplifier section output bias voltage generating section 2. The bias voltage generating section 2 produces a voltage Vd corresponding to the output bias voltage of the differential amplifier section 1. The output bias voltage Vd gate-biases the respective load MOS transistors Q3, Q5, ... Qn and by the transistors Q1 and Q2 of the converting section 5 the output of the differential amplifier section is potential shifted to the DC operating point of each linear amplifier stage. The circuit arrangement thus constructed gives the same characteristic for the transistors Q1, Q3, Q5, ... Qn and for the transistors Q2, Q4, Q6, ... Qn+1 when the circuit arrangement is fabricated in an integrated circuit. If the input voltages V1 and V2 are equal to each other, a relation Vod=Vd derived from the equation (1) makes all the gate voltages of the transistors Q1, Q3, Q5, ... Qn equal. This indicates that the input offset voltage in the comparator is minimized. Further, the voltage gain may be increased by increasing the number of the transistors, or the number of the linear amplifier stages.

Figure 2:
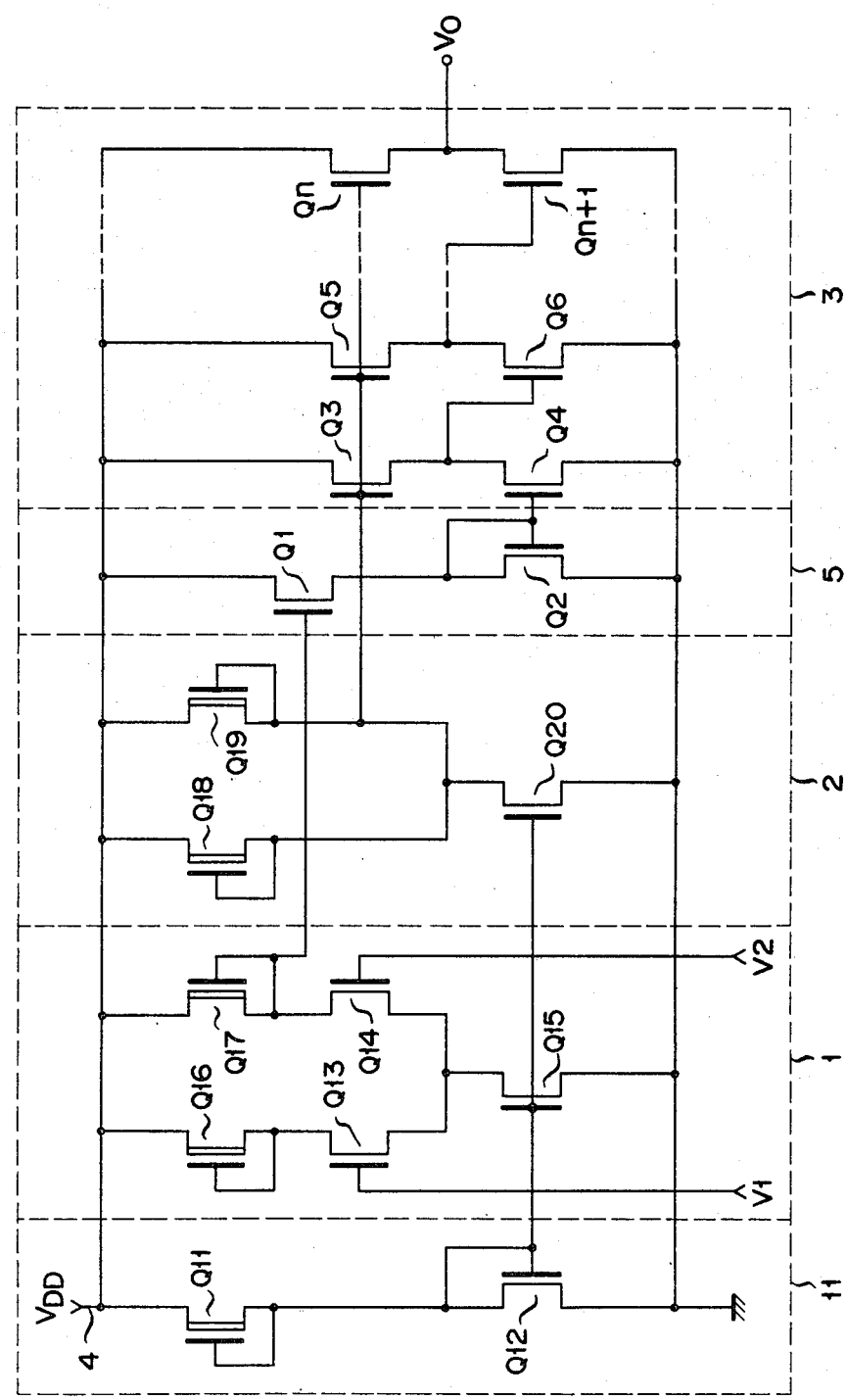
FIG. 2 is a detailed circuit diagram of the circuit shown in FIG. 1.

Turning now to FIG. 2, there is shown a detailed circuit diagram of the embodiment shown in FIG. 1. The circuit arrangement shown in FIG. 2 uses also N-channel transistors for all of the MOS transistors used. A constant current source bias section 11 supplies a constant current to the differential amplifier section 1 and the differential amplifier section output bias voltage generating section 2. Between the $V_{DD}$ potential supply terminal 4 and ground are connected a depletion type transistor Q11 and an enhancement type transistor Q12 in series fashion. The gate of the transistor Q11 is connected to the source of itself and the gate of the transistor Q12 is connected to the drain of itself.

In the differential amplifier section 1, the sources of differential input type enhancement transistors Q13 and Q14 are connected commonly and the connection point therebetween is grounded through an enhancement type constant power source transistor Q15. The gate of the input transistor Q13 is supplied with an input signal V1 and the gate of the input transistor Q14, with an input signal V2. The drains of the transistors Q13 and Q14 are connected to the power source terminal 4, through depletion type load MOS transistors Q16 and Q17. The gates of the transistors Q16 and Q17 are connected to the sources of themselves and to the gate of the drive transistor Q1 in the converting section 5.

In the differential amplifier section output bias voltage generating section 2, the drains of the depletion type load MOS transistors Q18 and Q19 are connected to power source terminal 4 and the sources of the transistors Q18 and Q19 are connected commonly. The common connecting terminal thereof is grounded through an enhancement type transistor Q20 for the constant current source. The gates of the transistors Q18 and Q19 are connected to the sources of themselves and the gates of the constant current source transistors Q15 and Q20 are connected to the source of the transistor Q11. The source of the transistor Q19 is connected to the gates of the load transistors Q3, Q5, ... Qn of the linear amplifier section 3.

Assume now that the transistors Q16, Q17, Q18 and Q19, the input state transistors Q13 and Q14, and the constant current source transistors Q15 and Q20, have the same characteristics respectively, and that a channel modulation of the transistors Q15 and Q20 is neglected. When the differential inputs V1 and V2 are equal, the source potential of the transistors Q16 and Q17 is equal to the source potential of the transistor Q19 or Q18. This potential is the output bias voltage Vd for the output voltage Vod of the differential amplifier section 1. By using the Vd, the gates of the load MOS transistors Q3, Q5, ... Qn of the linear amplifier stages are biased. The output of the differential amplifier section is applied to the gate of the transistor Q1 of the converting section 5. Since the load MOS transistors Q1, Q3, Q5, ... Qn are of the same type (characteristic) and the drive MOS transistors Q2, Q4, Q6, ... Qn+1 are of the same type (characteristic), when the input voltages V1 and V2 are equal to each other, the drain potentials of the transistors Q2, Q4, Q6, ... Qn+1 are exactly the same and lie on the DC operating point of each linear amplifier stage. Therefore, even if the number of the amplifier stages is increased, the input offset voltage is never increased.

Figure 3:
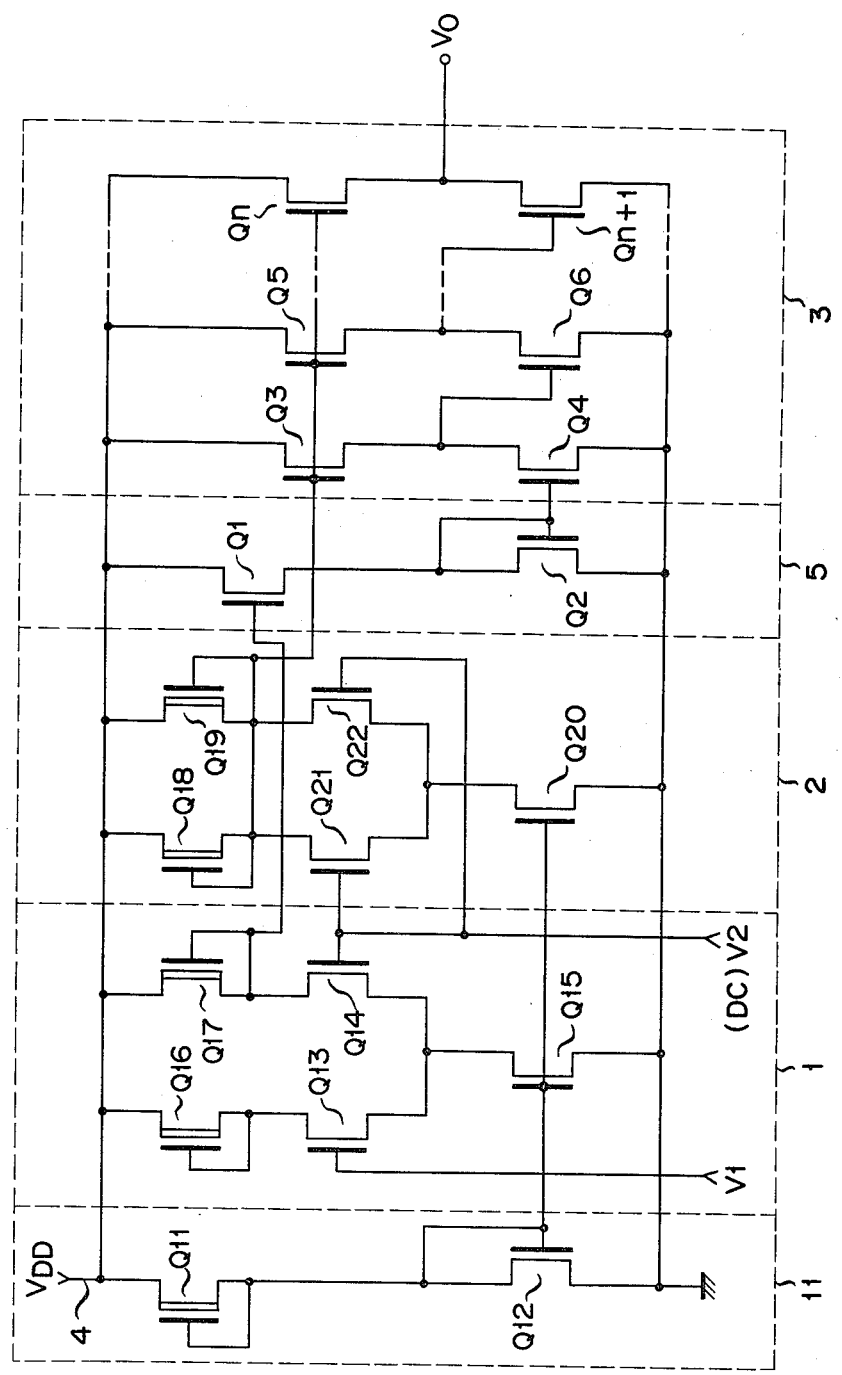
FIG. 3 is a circuit diagram of another example of the circuit shown in FIG. 1.

Turning to FIG. 3, there is shown a modification of the voltage comparator based on the principle shown in FIG. 1. The modification is so designed that the adverse effect by the channel modulation is negligible. In the figure, like symbols are used for designating like portions. The major differences of the FIG. 3 embodiment from the FIG. 2 embodiment are that the sources of the load MOS transistors Q18 and Q19 in the differential amplifier section output bias voltage generating section 2 are connected to each other, and that transistors Q21 and Q22 of the same type as the transistors Q18 and Q19 are connected between the constant current drive transistor Q20 and the transistors Q18 and Q19. Specifically, the drains of the transistors Q21 and Q22 are connected to each other and the sources of the transistors Q18 and Q19 are connected to each other. The sources of the transistors Q21 and Q22 are commonly connected and connected to the drain of the transistor Q20. The gate of the transistor Q21 is connected to the gate of the transistor Q14 and the connection point between them and the gate of the transistor Q22 are supplied with a DC voltage V2. With such a construction, the potential applied to the drain of the transistor Q15 is equal to that applied to the drain of the transistor Q20, a change of the effective channel length due to the drain voltage is negligible.

Figure 4:
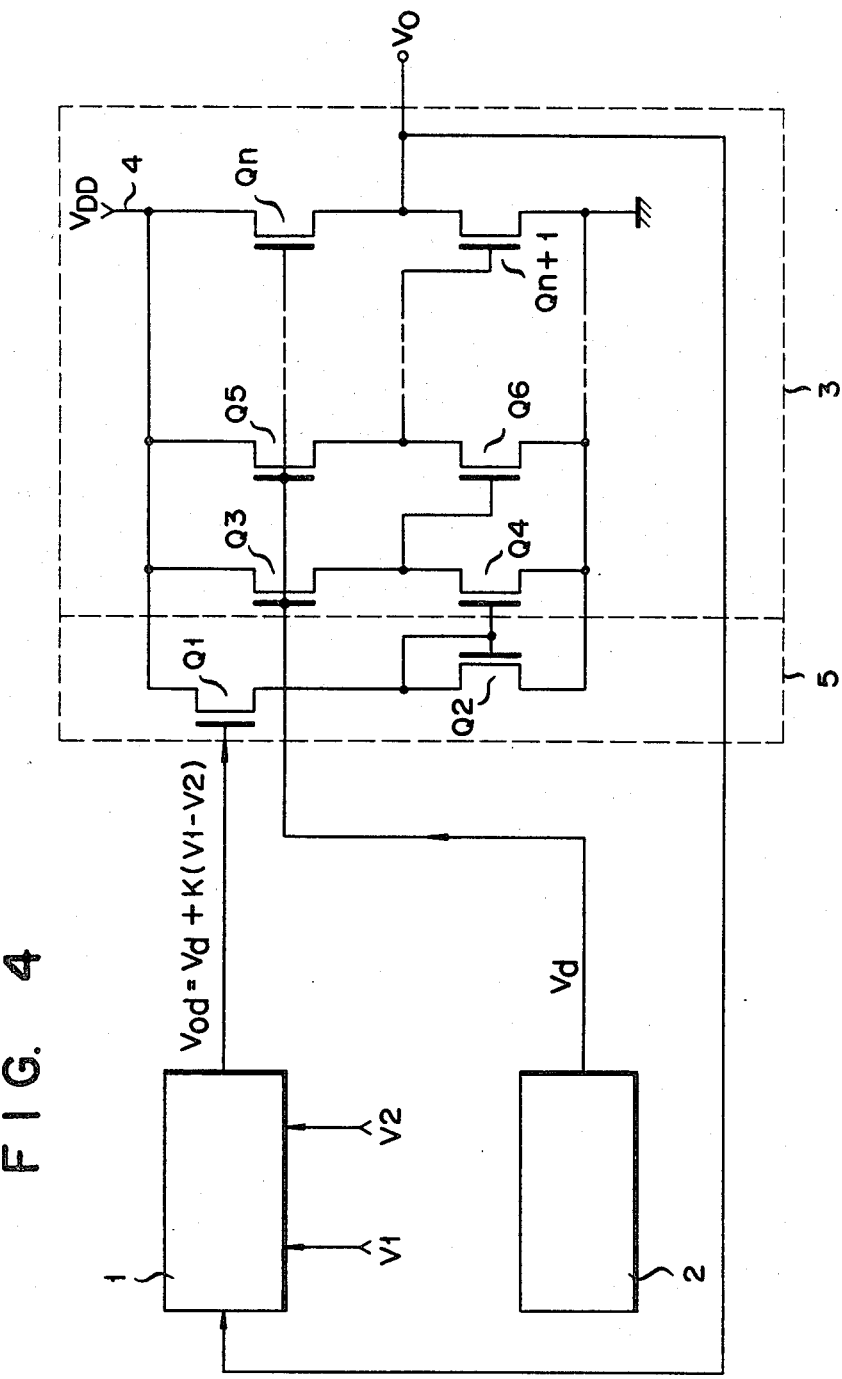
FIG. 4 is a block diagram of another embodiment of the voltage comparator circuit according to the present invention.

FIG. 4 is another embodiment of the voltage comparator according to the present invention. In the figure, like reference symbols are used to designate like portions in FIG. 1. A major difference of the embodiment of FIG. 4 from the embodiment shown in FIG. 1 is that the output voltage Vo from the linear amplifier section 3 is positively fed back to the differential amplifier section 1. The positive feed back input Vo to the differential amplifier section 1 is used to give a hysteresis characteristic to the input/output characteristic of the differential amplifier section 1 thereby to make the amplifier section 1 insensitive to unstable variation (noise) of the differential input. Specifically, when the voltage Vo is inverted, the inverted Vo is fixed to the inverted one so long as a noise exceeding to the hysteresis width is not inputted thereto.

Figure 5:
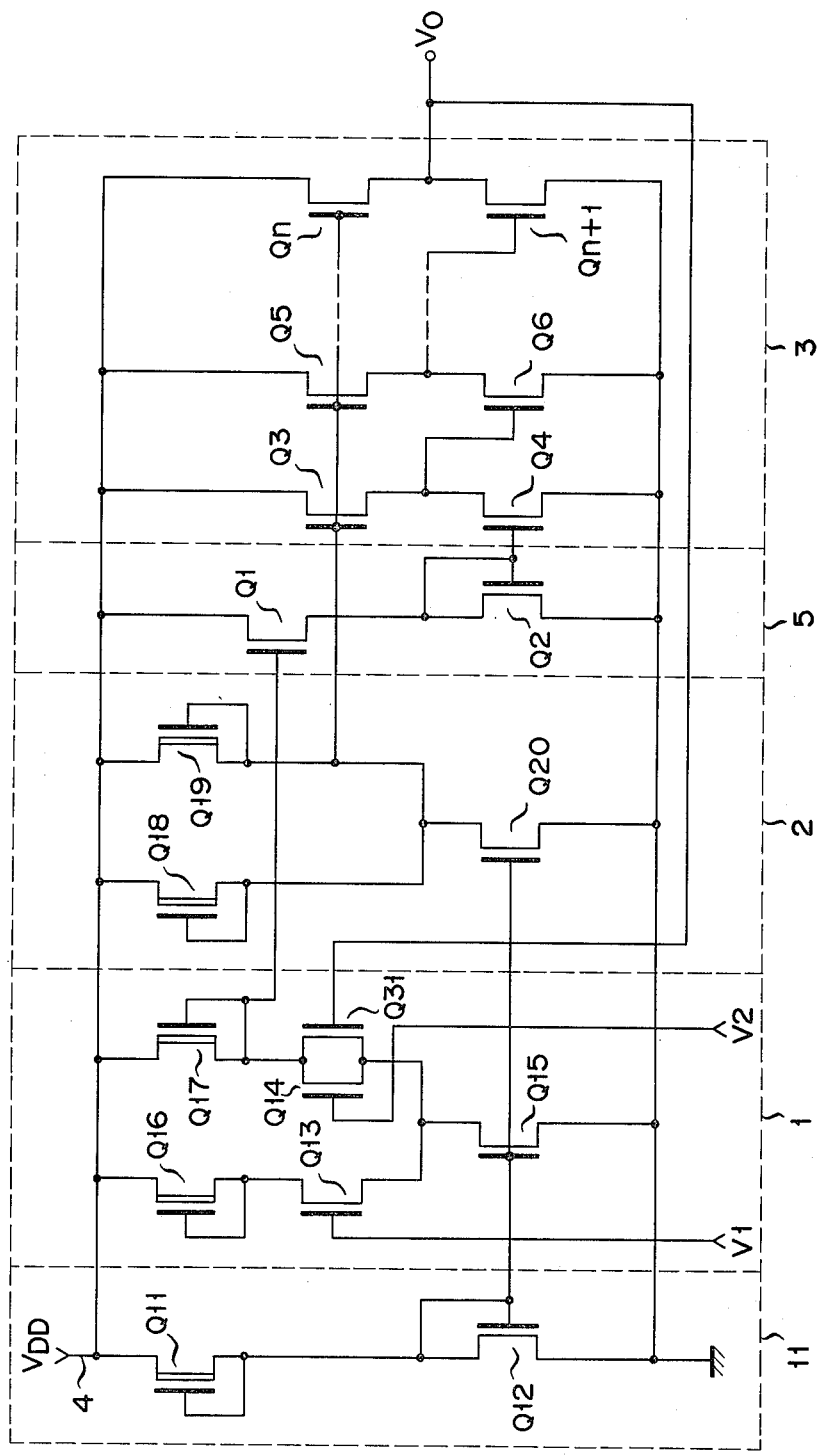
FIG. 5 is a circuit diagram of the circuit shown in FIG. 4.

FIG. 5 shows a detailed circuit diagram of the comparator based on the principle shown in FIG. 4. In FIG. 5, like symbols designate like portions in FIG. 2. A major difference of the present embodiment is that in the differential amplifier section 1 a transistor Q31 is connected to the differential input transistor Q14 in parallel. The transistor Q31 has a hysteresis characteristic for the input/output characteristic and receives at the gate the output Vo of the linear amplifier section 3.

In the comparator circuit thus constructed, when the output Vo of the comparator is logical "1", the transistor Q31 of the differential amplifier section 1 is at ON state. Therefore, so long as the current of the transistor Q13 does not exceed the sum current of the transistors Q14 and Q3, namely, the input voltage providing such current is not inputted thereto, the output voltage Vo of the comparator output does not invert to logical "0".

When the comparator output Vo="0", the transistor Q31 is at OFF state. Therefore, Vo="1" is not obtained until the input voltage V1 falls to such an extent that the current value of the transistor Q13 is below the current of the transistor Q14. Such a hysteresis characteristic is determined by the transistor Q31 and if the $g_m$ (mutual conductance) of the transistor Q31 is made large, the width of the hysteresis characteristic is large and the noise characteristic is improved.

FIG. 6 shows another modification of the comparator circuit based on the principle in FIG. 4, in which the adverse effect by the channel modification is negligible. In the figure, like symbols are representative of like portions shown in FIG. 5. The major differences of the present embodiment from that shown in FIG. 5 are that the sources of the load MOS transistors Q18 and Q19 in the differential amplifier section output bias voltages generating section 2 are connected to each other as in the case of FIG. 3, and that transistors Q21 and Q22 of the same type as the transistors Q13 and Q14 are connected between the constant current drive transistor Q20 and the transistors Q18 and Q19. Therefore, a change of the effective change length caused by the drain voltages of the constant current transistors Q15 and Q20 may be neglected. The operation of the present embodiment is similar to that of the FIG. 3 embodiment and therefore the explanation thereof will be omitted.

As described above, a voltage corresponding to the output bias voltage of the differential amplifier section is produced and is used as a control signal for the load element of the linear amplifier stage. Therefore, the input offset signal is minimized while the voltage gain is large. Further the differential amplifier section has the hysteresis for the input/output characteristic, so that the comparator circuit of the invention is insensitive to the noise.

The present invention may be modified or changed variously within the scope of the invention. For example, the depletion type transistors Q11, Q16 to Q19 may be replaced by the enhancement type transistors and in this case the gate connection is directed to the drain side of these transistors. While the embodiments as mentioned above use the single channel type MOS transistors for the comparators, bipolar type or CMOS type transistors may be used for the comparator of the present invention.

What we claim is:

1. A voltage comparator comprising:
   a differential amplifier section for producing a signal corresponding to a difference between two input signals;
   a differential amplifier section output bias voltage generating section for producing a voltage corresponding to the output bias voltage of said differential amplifier section;
   a linear amplifier section in which a plurality of driver elements and a plurality of load elements are connected, and of which a DC operating point is determined by a voltage from said differential amplifier section output bias voltage generating section; and
   a converting section which is inserted between said differential amplifier section and said linear amplifier section, and converts the DC output bias voltage from said differential amplifier section into the DC operating point of said linear amplifier section; wherein said differential amplifier section, the differential amplifier section output bias voltage generating section, said linear amplifier section, and said converting section are comprised of MOS transistors of the same channel.

2. A voltage comparator circuit according to claim 1, wherein said linear amplifier section is comprised of a plurality of amplifier circuits each including a load MOS transistor connected at the gate to said differential amplifier section output bias voltage generating section and a drive MOS transistor connected at the gate to the output terminal of said converting section.

3. A voltage comparator circuit according to claim 2, wherein said converting section is comprised of an input MOS transistor connected at the gate to the output terminal of said differential amplifier section and a load MOS transistor connected in series to said input MOS transistor.

4. A voltage comparator circuit according to claim 3, wherein the load MOS transistor of said linear amplifier section and the input MOS transistor of said converting section, the drive MOS transistor of said linear amplifier section and the load MOS transistor of said converting section have the same configuration, respectively.

5. A voltage comparator circuit according to claims 1, 2, 3 or 4, wherein said differential amplifier section is comprised of a current source, a couple of input MOS transistors connected at the gates to the input terminal, and loads connected to said input MOS transistors in series and said differential amplifier section output bias voltage generating section is comprised of a current source connected in series thereto and a load.

6. A voltage comparator circuit according to claim 5, wherein said differential amplifier output bias voltage generating section has the same construction as that of said differential amplifier section and their inputs are also commonly constructed.

7. A voltage comparator circuit according to claim 6, wherein one connection point between the input transistor and the load of said differential amplifier section output bias voltage generating section is connected to the other connection point thereof.

8. A voltage comparator circuit according to claim 5, further including a constant current source having an MOS transistor of which the gate and the drain are connected commonly, and a load, wherein said gate is connected to the gate of an MOS transistor constituting a current source of said differential amplifier section output bias voltage generating section, to form a current mirror construction.

9. A voltage comparator circuit according to claim 5 wherein the output of said linear amplifier section is fed back to said differential amplifier section.

10. A voltage comparator circuit according to claim 9, wherein said differential amplifier section includes an MOS transistor connected parallel to one of said input MOS transistors and the gate of which is connected to the output of said linear amplifier section.

11. A voltage comparator circuit according to claim 6, further including a constant current source having an MOS transistor of which the gate and the drain are connected commonly, and a load, wherein said gate is connected to the gate of an MOS transistor constituting a current source of said differential amplifier section output bias voltage generating section, to form a current mirror construction.

12. A voltage comparator circuit according to claim 7, further including a constant current source having an MOS transistor of which the gate and the drain are connected commonly, and a load, wherein said gate is connected to the gate of an MOS transistor constituting a current source of said differential amplifier section output bias voltage generating section, to form a current mirror construction.

13. A voltage comparator circuit according to claim 6 wherein the output of said linear amplifier section is fed back to said differential amplifier section.

14. A voltage comparator circuit according to claim 7 wherein the output of said linear amplifier section is fed back to said differential amplifier section.

15. A voltage comparator circuit according to claim 8 wherein the output of said linear amplifier section is fed back to said differential amplifier section.

16. A voltage comparator circuit according to claim 11 wherein the output of said linear amplifier section is fed back to said differential amplifier section.

17. A voltage comparator circuit according to claim 12 wherein the output of said linear amplifier section is fed back to said differential amplifier section.

18. A voltage comparator circuit according to claim 13 wherein said differential amplifier section includes an MOS transistor connected parallel to one of said input MOS transistors and the gate of which is connected to the output of said linear amplifier section.

19. A voltage comparator circuit according to claim 14, wherein said differential amplifier section includes an MOS transistor connected parallel to one of said input MOS transistors and the gate of which is connected to the output of said linear amplifier section.

20. A voltage comparator circuit according to claim 15, wherein said differential amplifier section includes an MOS transistor connected parallel to one of said input MOS transistors and the gate of which is connected to the output of said linear amplifier section.

21. A voltage comparator circuit according to claim 16, wherein said differential amplifier section includes an MOS transistor connected parallel to one of said input MOS transistors and the gate of which is connected to the output of said linear amplifier section.

22. A voltage comparator circuit according to claim 17, wherein said differential amplifier section includes an MOS transistor connected parallel to one of said input MOS transistors and the gate of which is connected to the output of said linear amplifier section.

* * * * *